United States Patent
Fredeman et al.

(10) Patent No.: US 6,768,143 B1
(45) Date of Patent: Jul. 27, 2004

(54) STRUCTURE AND METHOD OF MAKING THREE FINGER FOLDED FIELD EFFECT TRANSISTORS HAVING SHARED JUNCTIONS

(75) Inventors: Gregory J. Fredeman, Staatsburg, NY (US); John W. Golz, Garrison, NY (US); David R. Hanson, Brewster, NY (US); Hoki Kim, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,913

(22) Filed: Aug. 26, 2003

(51) Int. Cl.[7] .............................. H01L 27/10
(52) U.S. Cl. ................ 257/206; 257/202; 257/204; 257/205; 257/276; 257/272; 257/280; 257/283
(58) Field of Search ................ 257/206, 276, 257/728, 522, 202, 365, 182, 368, 283, 284, 287; 436/574, 579, 162

(56) References Cited

U.S. PATENT DOCUMENTS

| | | | |
|---|---|---|---|
| 5,818,077 A | * | 10/1998 | Takahashi et al. .......... 257/276 |
| 6,081,006 A | * | 6/2000 | Nelson ........................ 257/276 |
| 6,236,258 B1 | | 5/2001 | Hoenigschmid et al. |
| 6,392,278 B1 | * | 5/2002 | Kimura ........................ 257/401 |
| 2003/0085428 A1 | * | 5/2003 | Nelson et al. ............... 257/368 |

* cited by examiner

*Primary Examiner*—Nathan J. Flynn
*Assistant Examiner*—Fazli Erdem
(74) *Attorney, Agent, or Firm*—Daryl K. Neff; H. Daniel Schnurmann

(57) ABSTRACT

An integrated circuit including a field effect transistor (FET) is provided in which the gate conducter has an even number of fingers disposed between alternating source and drain regions of a substrate. The fingers are disposed in a pattern over an area of the substrate having a length in a horizontal direction, the area equaling the length multiplied by a width in a vertical direction that is occupied by an odd number of the fingers.

20 Claims, 6 Drawing Sheets

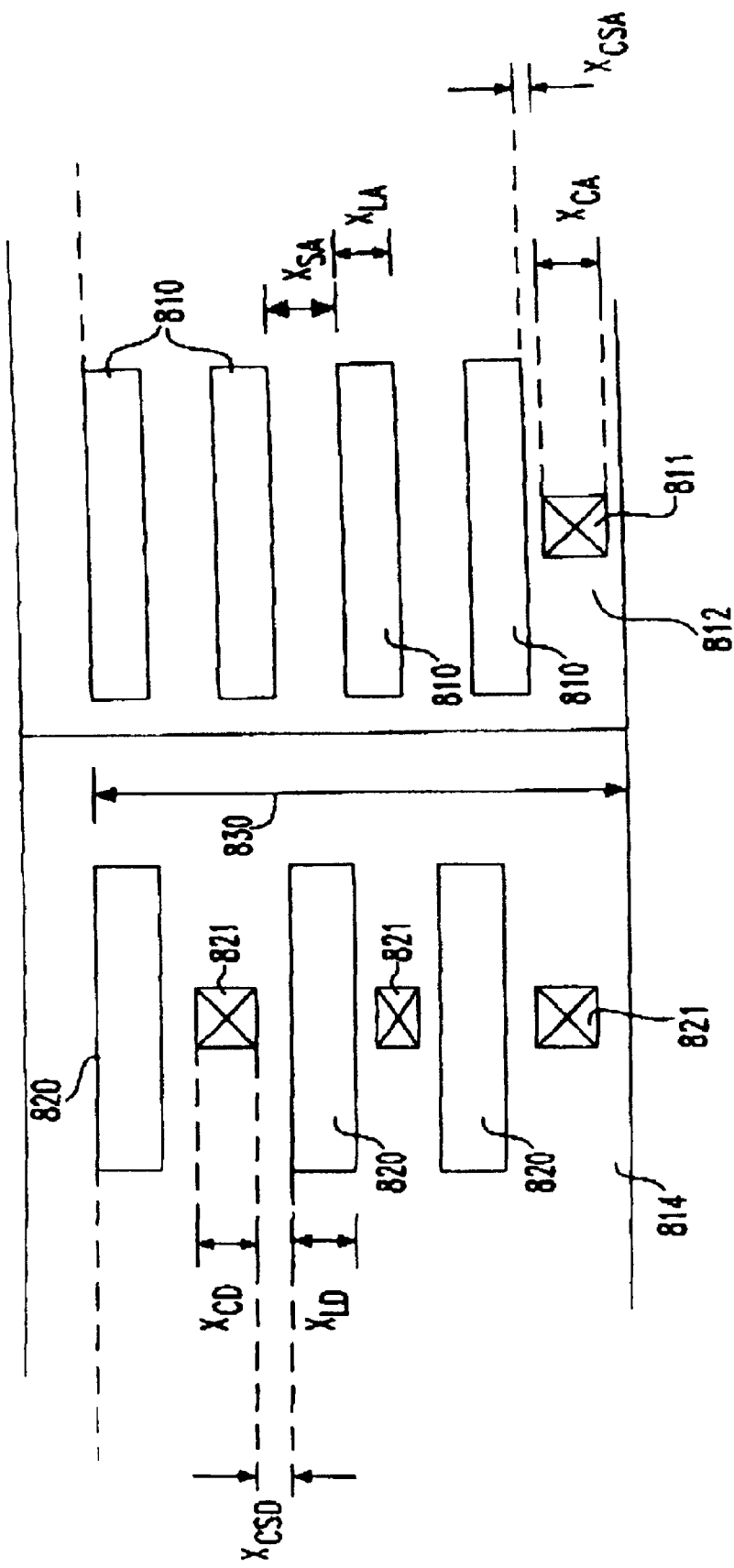

STRUCTURE AND METHOD OF MAKING THREE FINGER FOLDED FIELD EFFECT TRANSISTORS HAVING SHARED JUNCTIONS

BACKGROUND OF INVENTION

The present invention relates to semiconductor integrated circuits and more specifically to the layout of semiconductor devices, especially for a semiconductor memory.

Operational performance and conservation of integrated circuit "chip" area are considerable in the design of circuits. It is desirable to reduce chip area because circuit designs that occupy smaller chip areas generally offer higher interconnect performance and speed. Circuit designs that occupy large chip areas typically have longer interconnect wiring which degrades performance. Longer wires have higher parasitic capacitance and resistance, either of which increases delay.

Because of their high integration density, dynamic random access memories are a favored way of storing large amounts of information for ready access within a computing system. A typical dynamic random access memory (DRAM) 10 consists of a data storage array 12, a bit line access system 14, a word line select system 16, control logic 18, and an external interface 20, as shown in FIG. 1.

FIG. 2 provides a detailed illustration of a DRAM 110 corresponding to DRAM 10 shown in FIG. 1. As shown in FIG. 2, data storage array 112 corresponds to data storage array 12 shown in FIG. 1 and block 116 corresponds to wordline select system 16 shown in FIG. 1. The bitline (data) access system 14, control logic 18 and external interface 20 are not shown in FIG. 2.

As used herein, the terms "horizontal" and "horizontally", "vertical" and "vertically" describe directions generally parallel to the main surface of a semiconductor substrate, horizontal being the direction in which wordlines extend across the substrate, and vertical being the direction in which bitlines extend across the substrate. As shown in FIG. 2, the bitlines 100, 102 and 104 run vertically in columns across the data storage array 112, traversing the wordlines 120, 122 and 124 which run horizontally in rows across the data storage array 112. Data storage cells (e.g. Data Cell (0,0)) are provided at the intersections between the bitlines and the wordlines. The wordlines of the data storage array 112 have a pitch 130. Pitch is defined as the dimension occupied by a recurring feature and its spacing to the next recurring feature in a line of such features.

It is desirable that the pitch 130 of wordlines in the data storage array 112 be kept as small as possible for the following reasons. First, the data storage array 112 should store as much information as possible within a given area of an integrated circuit (hereinafter, a "chip"). Accordingly, data storage cells and the wordlines and bitlines that provide access to the data stored therein should be packed as closely together as possible.

Second, the wordline pitch 130 should be made small because the length of the bitlines in the data storage array 112 is directly controlled by the wordline pitch. The length of the bitlines spanning a data storage array 112 should be made as short as possible in order to best transfer signals on each bitline, e.g. bitline 100, to and from a data cell (e.g. Data Cell (0,0) 106) of the data storage array 112. Parasitic bitline capacitance, which affects both the speed and the validity of signals transferred on a bitline, increases with the length of the bitline. Keeping bitlines short reduces the parasitic capacitance and improves the quality of the bitline signal.

As further shown in FIG. 2, the word lines in the data storage array 112 are driven by a word line select system 116. Each wordline is activated by a corresponding driver, upon the driver receiving an enabling decoded input from wordline select decoder 117 and decoded power supply input for the particular bank. For example, wordline 120 is activated by a driver 150 when enabling decoded input 119 is received from wordline select decoder 117 together with a decoded power supply input BK2 for a bank 2 of the data storage array 112.

FIG. 3 is a diagram illustrating the timing of operations within the data storage array 112. As illustrated in FIG. 3, an operation to read a data bit from or write a data bit to a data cell is provided in three phases. In a first phase, 300, bitlines are precharged and equalized by signal EQ to a desirable voltage. Thereafter, at the start of the next phase 310, EQ is lowered and the wordline is activated, as indicated by the rising signal WL. During this phase, the activated wordline turns on transistors of data cells, which results in the transfer of stored charge from storage capacitors of the data cells to bitlines. The bitlines, in turn, transfer the charge retrieved from data cells as data bit signals to sense amplifiers.

At the start of the next phase 320, the transfer of the data bit signal from the data cell to sense amplifier is about complete. During this phase 320, which commences with the rising SET signal, each sense amplifier amplifies a data bit signal for the purpose of outputting the data bit from the DRAM, and/or for restoring the data bit to the data cell of the data storage array 112.

During phase 320, the data bits accessed from data cells by the activated wordline are written back, i.e. restored to the data cells. The data access cycle is now completed. Accordingly, the wordline is now deactivated, as marked by the falling signal WL, and a precharge phase 330 begins for a new data access cycle.

The cycle time for accessing the data stored in a data cell is the sum of the length of phases 300, 310 and 320. As apparent from the above description, two factors contribute heavily to the cycle time.

The first is the length of time, i.e., the duration of the phase 310, that is required to transfer data bit signals from storage capacitors of data cells to sense amplifiers. The duration of this phase 310 is influenced heavily by the amount of parasitic capacitance of the bitline. The time delay for a data bit signal to be transferred from a data cell to a sense amplifier is measured in terms of an "RC" delay determined by the resistance "R" of the bitline multiplied by the capacitance "C" of the bitline. The resistance and parasitic capacitance of a bitline are directly proportional to the length of the bitline. Accordingly, the length of bitlines must be kept as small as practicable in order to provide desirably short cycle time.

In addition to determining the RC delay, the amount of the bitline capacitance also affects the maximum voltage which appears on the bitline at the sense amplifier during the phase 310 in which charge is transferred from data cell to sense amplifier. The greater the bitline capacitance, the smaller the voltage appears at the sense amplifier. Thus, high bitline capacitance increases the chance that the data bit signal is amplified incorrectly, for example, that a signal from a data cell storing a value of "1" is amplified as a "0" or vice versa. To counteract signal loss due to increased bitline capacitance, the voltage stored in the data cell must be increased. Such increase typically requires increasing the duration of phase 320 in order to lengthen the write-back time for storing a data bit signal from sense amplifier to data cell. This also increases cycle time.

A second factor contributing to the length of the cycle time is the transition time of the wordline WL. As shown in FIG. 3, at the beginning of the signal development phase 310, the wordline WL rises from an deactivated level to an activated level over a rising transition time 340. The wordline remains at the activated level throughout phases 310 and 320 and then falls back to the deactivated level over a falling transition time 350. These transition times represent wasted time because the voltage level of the wordline is then intermediate between activated and deactivated levels and therefore cannot be relied upon for operations. Thus, the rising and falling transition times of the wordline represent wasted time that contributes directly to the overall cycle time of the memory.

Accordingly, it would be desirable to reduce the transition times of the wordline in order to shorten the memory access cycle time. However, the wordlines themselves have parasitic capacitive loads 140 (FIG. 2) that must be driven in order for the wordline to transition between inactive and active levels. For a given amount of capacitance, the speed at which the wordline transitions is directly related to the amount of current that the driver circuit for that wordline can source or sink. Therefore, for fast switching, it is desirable that the wordline driver circuit (hereinafter, "wordline driver") be able to source and sink a large amount of current.

The amount of drive current output by a wordline driver is determined by the width to length ratio of the FET channel that makes up the wordline driver. The width of the FET channel corresponds to the length of the gate conductor of the FET, and the length of the FET channel is determined by the width of the gate conductor. Since the length of the FET channel is already fixed at a desirably small dimension by the particular technology employed in a given generation, width is the only parameter capable of being changed to increase the drive current. Because the wordline drivers already occupy a given area of the chip outside the data storage array 112, it would be desirable to increase the width of the FET channel without increasing the amount of chip area occupied by each driver.

A typical layout of a word line driver FET 400 is shown in FIG. 4. A wordline driver typically includes both a p-type FET (PFET) and an n-type FET. In the following description, reference will be made to both PFET and NFET simply as a "FET," with the understanding that the description applies to both transistor types of the driver. Only one such FET 400 is illustrated in FIG. 4. The FET 400 includes a gate conductor 410 operated by decoded input from a wordline select decoder (117 of FIG. 2) and a source region 420 and a drain region 430 on each side of the gate conductor 410. A plurality of contacts 422 are provided to source region 420 and a plurality of contacts 424 are provided to drain region 430. When the FET 400 is an NFET, the source region 420 is connected to ground and the drain region 430 provides the output current of the FET 400. Otherwise, when the FET 400 is a PFET, the source region 420 is connected to a wordline power supply, for example, a boosted wordline driver power supply, which may be provided thereto as a decoded bank power supply voltage input. In such case, the drain region 430 provides the output current of the FET 400.

The particular layout of the wordline driver FET 400 in FIG. 4 is not optimized to conserve chip area. The source region 420 and the drain region 430 of each FET 400 lie along respective edges 440 and 450 of the FET 400. Because of that, when FETs 400 are placed next to each other in a layout, neither the source region 420 nor the drain region 430 of the FETs 500 can be shared, as the sources of all FETs is maintained at a fixed potential while the drains provide the drive current. Moreover, the juxtaposition of the source region 420 of a first FET 400 to the drain region 430 of a second FET 400 requires that there be an isolating gap in the semiconductor area between the two FETs, thus wasting valuable chip area.

As shown in FIG. 5, if space is available for the wordline driver within the pitch of wordlines of the data storage array 112, the FET 500 can be fabricated with a plurality of fingers to increase the drive current, as represented by a plurality of gate conductors 510, 512.

In a multiple-fingered FET 500, the width of the transistor channel $W_{channel}$ is increased to an amount equal to: $W_{channel} = N_{finger} * I_{diffusion}$ where Nfinger equals the number of fingers of the transistor and $I_{diffusion}$ equals the current output from each source region or each drain region of the transistor.

The FET 500 shown in FIG. 5 has two fingers in which a central source region 514 is shared between two FETs having gate conductors 510 and 512. Thus, the channel width is increased to two times the amount of $I_{diffusion}$. In this arrangement, the FET 500 has a pair of drain regions 516 and 518 lying along the outside edges. Because of that, FETs 500 that are placed adjacent to each other in a layout can share drain regions. This, in turn, helps maximize the utilization of chip area along a direction of the width 520 of the semiconductor area for each FET 500.

SUMMARY OF INVENTION

According to an aspect of the invention, an integrated circuit including a field effect transistor (FET) is provided in which the gate conductor has an even number of fingers disposed between alternating source and drain regions of a substrate. The fingers are disposed in a pattern over an area of the substrate having a length in a horizontal direction, the area equaling the length multiplied by a width in a vertical direction that is occupied by an odd number of the fingers.

According to another aspect of the invention, an integrated circuit is provided which includes a plurality of wordline drivers. Each wordline driver includes a first field effect transistor (FET) that is conductively connected to a wordline of a data storage array for driving a voltage on the wordline. The first FET is arranged in a column of FETs including the first FET and a second FET disposed adjacent to the first FET, such that a source region of the first FET is shared with a source region of the second FET. The first FET includes a gate conductor having an even number of fingers disposed between alternating source and drain regions of a substrate, wherein the fingers are disposed in an L-shaped pattern over an area of the substrate having a length in a horizontal direction, in which the area further equals that length multiplied by a width in a vertical direction that is occupied by an odd number of fingers.

According to another aspect of the invention, a method of is provided for making a field effect transistor (FET) of an integrated circuit. The method includes forming a gate conductor having an even number of fingers, the fingers being disposed in a pattern over an area of a substrate having a length in a horizontal direction, wherein the area equals that length multiplied by a width in a vertical direction that is occupied by an odd number of fingers. The method further includes forming a plurality of source regions and drain regions in the substrate alternating with the fingers.

BRIEF DESCRIPTION OF DRAWINGS

FIG. 8 is a plan view illustrating size and placement of gate conductor fingers of a wordline driver FET in relation to the wordlines in a DRAM according to an embodiment of the invention.

DETAILED DESCRIPTION

According to embodiments of the invention described herein, a field effect transistor (FET) is provided for a wordline driver which takes advantage of available chip area to increase the effective width of the FET. In such manner, greater drive current can be obtained in a FET formed in the same chip area.

Figure 6:
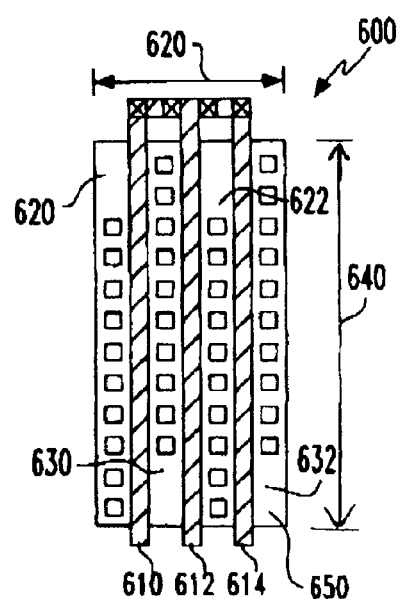
FIG. 6 is a plan view illustrating the structure of a three finger field effect transistor (FET) of a wordline driver which is background to the invention but which is not admitted to be prior art.

Circumstances exist in which available chip area supports a wordline driver FET having only an odd number of gate conductor fingers. In order to maximize the output current of the wordline driver FET, it is desirable to fabricate wordline driver FETs having as many fingers as can be fitted within the available vertical space allotted thereto in the DRAM. FIG. 6 illustrates a three-fingered FET 600, which is background to the invention but which is not admitted to be prior art. As shown in FIG. 6, the three-fingered FET 600 is provided over an active area 650 having a width 620 in a vertical direction (the direction transverse to the wordlines) and a length 640 in a horizontal direction (the direction parallel to the wordlines). The FET 600 has three gate conductor fingers 610, 612, and 614, and corresponding source regions 620, 622 and drain regions 630, 632.

Assume that the horizontal length 640 of the active area 650 of the FET 600 is the same as that of the FET 500. Because the FET 600 has more fingers than the prior art FET 500, the FET 600 has a larger transistor channel width, and therefore, a higher output drive current, for the same horizontal length of the active area. However, FET 600 has the same disadvantage as FET 400 in that source regions or drain regions of FETs in a layout adjacent to each other cannot be shared, and therefore, an area-wasting isolation gap must be provided between such FETs. Moreover, especially in newer transistor technologies, an isolation gap may create a physical stress on the silicon and reduce the current drive of the FET. Hence, it is more desirable than ever to maintain a continuous strip of active area without any isolation gaps.

Thus, fabrication of a wordline driver FET having an odd number of gate conductor fingers is problematic because of the inability of adjacent FETs in such arrangement to share transistor regions (e.g. source regions). Such problem is resolved in the embodiments of the present invention by providing interleaved L-shaped wordline driver FETs having an even number of gate conductor fingers which are provided in an L-shape.

According to the embodiments of the invention described herein, a FET is provided having an even number of gate conductor fingers disposed between alternating source and drain regions of a single-crystal semiconductor region of a substrate. The even number of gate conductor fingers are disposed at a pitch corresponding to an odd number of gate conductor fingers occupying the vertical space allotted to the FET. In such manner, source regions of the FET are able to be shared between neighboring ones of the FETs. The even number is obtained by "folding" the layout of the FET into an L-shape such that a first horizontal portion of the FET has a first even number of fingers, for example two, and a second horizontal portion of the FET has a different even number of fingers, for example four. Two such adjacent L-shaped FETs are interleaved such that the FETs each effectively have a pitch of three, without there being an isolation gap between the two FETs.

Figure 7:
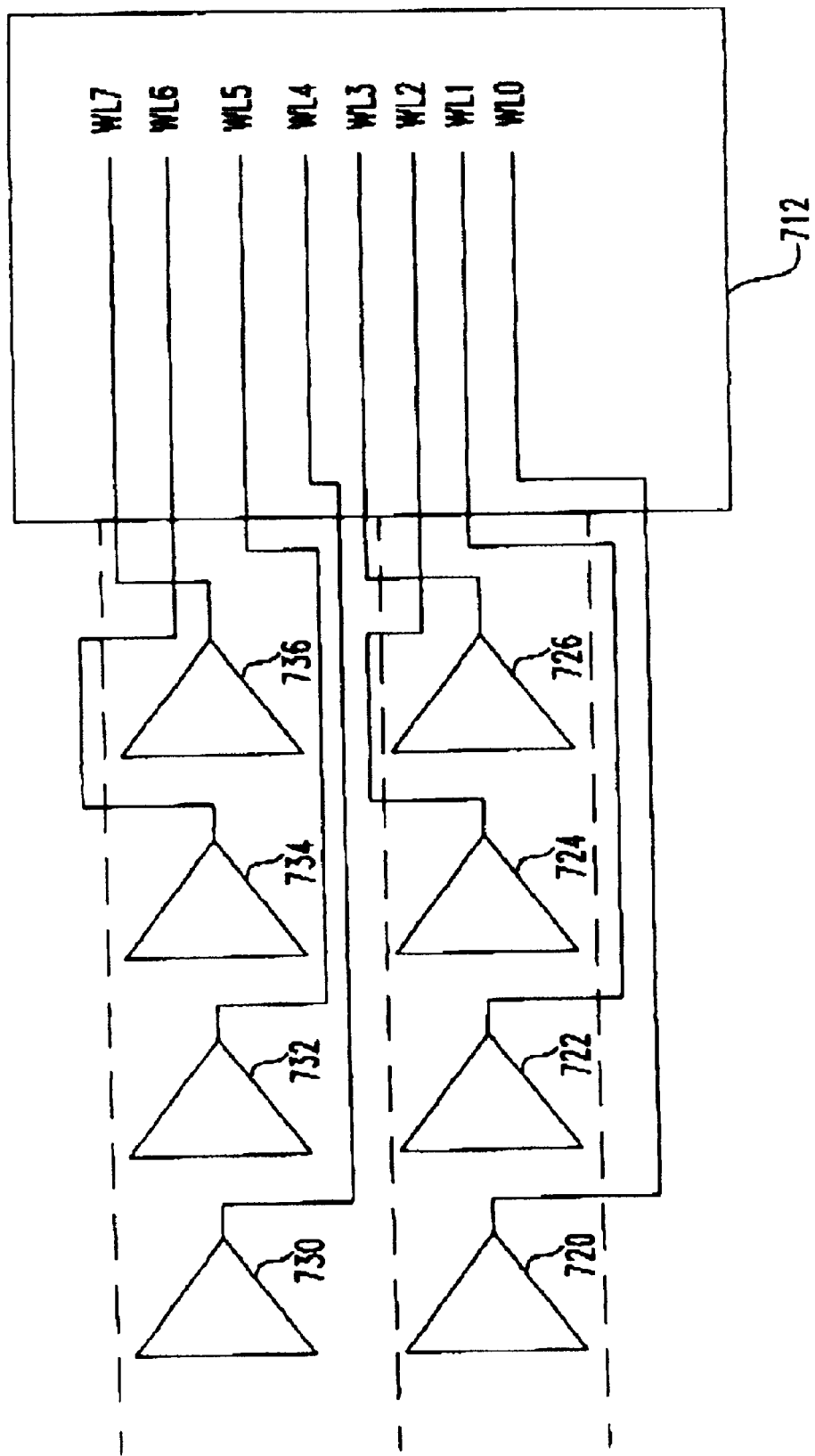
FIG. 7 is a block and schematic diagram illustrating placement and interconnection of wordline drivers relative to wordlines in a DRAM according to an embodiment of the invention.

FIG. 7 illustrates a preferred interconnection of wordline drivers 720–726 to wordlines WL0–WL3 of a data storage array and of wordline drivers 730–736 to wordlines WL4–WL7 of a data storage array. Each set of four wordline drivers, e.g. 720–726, are horizontally stacked to the side of the data storage array 712. The drivers thus occupy area of the chip extending outward from the edge of the data storage array 712. The wordlines of the data storage array 712 have fixed pitch, which is desirably small for the reasons discussed above. In order to provide consistent operation and to avoid possible differences in the timing of wordline operation from one wordline to another, the capacitive load on each word line is made uniform from one wordline to another. To achieve this, the pitch of the wordline drivers, e.g. the pitch of drivers 720–726, is provided in a way to match exactly the pitch of wordlines in the data storage array 712, e.g., the pitch of wordlines WL0–WL3. In such manner, physical interconnections between the wordline drivers and the wordlines are provided at uniform pitch for the whole data storage array 712. This also poses constraints on the physical layout of the field effect transistors (FETs) that make up the driver, as well as the wiring of the driver.

In the embodiments of the invention described herein, the drive current output by wordline drivers is increased by increasing the width of the channels of field effect transistors (FETs) used in the wordline drivers. Width, as a parameter, is specifically increased because the drive current output by the wordline driver can only be increased by increasing the width to length ratio of the FET channel, and the length of the FET channel is already fixed by transistor processing technology. Further, because the pitch of wordlines WL0, etc. in the data storage array 712 provides sufficient space to increase the number of fingers of the wordline driver FET in a direction of the wordline pitch, as described below, the width of the transistor channel of the FET can be increased without requiring an increase in the amount of chip area occupied by each FET. This is described as follows.

FIG. 8 illustrates the placement of wordlines 810 within a data storage array 812 of a dynamic random access memory (DRAM), in relation to gate conductor fingers 820 of a FET 814 of a wordline driver provided according to an embodiment of the invention. This example assumes an arrangement as shown in FIG. 7 in which four wordline drivers are horizontally stacked. Each FET 814 of each of the four drivers has a width 830 in the vertical direction equivalent to the width 830 of the data storage array 812 over which four wordlines 810 are provided. Because of the different technologies involved in fabricating transistors of the data storage array 812 and those of the FET 814, the wordlines 810 are formed at a tighter pitch than the gate conductor fingers 820 of the FET 814. As shown in FIG. 8, the pitch of the word lines supports a pitch of three for the gate conductor fingers of the FET 814.

This is illustrated in FIG. 8 as follows. Four wordlines 810 are provided within a given width 830 of the data storage array 812. The four wordlines 810 each has a given width $X_{LA}$ and spacing $X_{SA}$ between wordlines 810. In addition, a contact 811 is provided to the data storage array 812 having width $X_{CA}$, that contact providing an interconnection of one of the wordlines 810 to a FET 814. The contact is spaced from the wordline 810 by a spacing $X_{CSA}$. Therefore, within the vertical dimension 830, wordlines, a contact and associated spacings are provided having a combined width of $4X_{LA} + 3X_{SA} + 2X_{CSA} + X_{CA}$.

On the other hand, in the FET 814, the minimum width of each gate conductor finger is $X_{LD}$, the minimum width of each contact 821 is $X_{CD}$, and the minimum spacing from gate conductor finger to contact is $X_{CSD}$. As shown in FIG. 8, three such gate conductor fingers 820 can be accommodated within the allotted vertical dimension 830. The combined width of the gate conductor fingers, contacts and associated spacings within width 830 is $3X_{LD} + 6X_{CSD} + 3X_{CD}$.

Therefore, in an arrangement in which four wordline drivers are horizontally stacked, each FET 814 can be provided having three gate conductor fingers 820 whenever the following relation is satisfied: $3X_{LD} + 6X_{CSD} + 3X_{CD}$ (FET) $< 4X_{LA} + 3X_{SA} + 2X_{CSA} + X_{CA}$ (Array).

However, as noted above with respect to FIG. 6, there is a problem implementing an. FET 600 having three parallel gate conductor fingers 610, 612, 614. The source region 620 and the drain region 632 on the outside edges of the FET 600 cannot be shared, therefor requiring an isolating structure to be formed between adjacent FETs 600.

Figure 1:
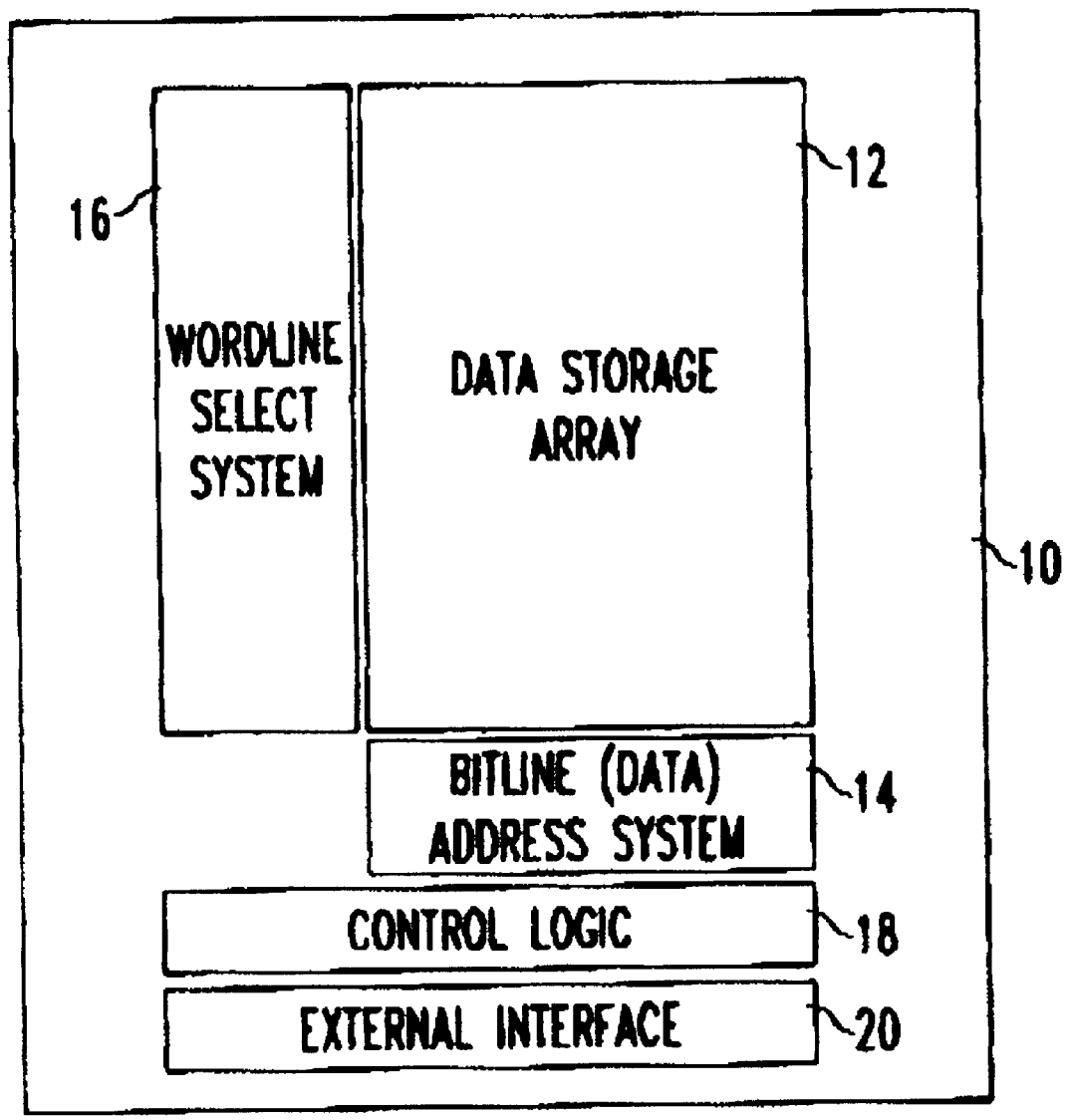
FIG. 1 is a functional block diagram illustrating the organization of a dynamic random access memory (DRAM) according to the prior art.
Figure 2:
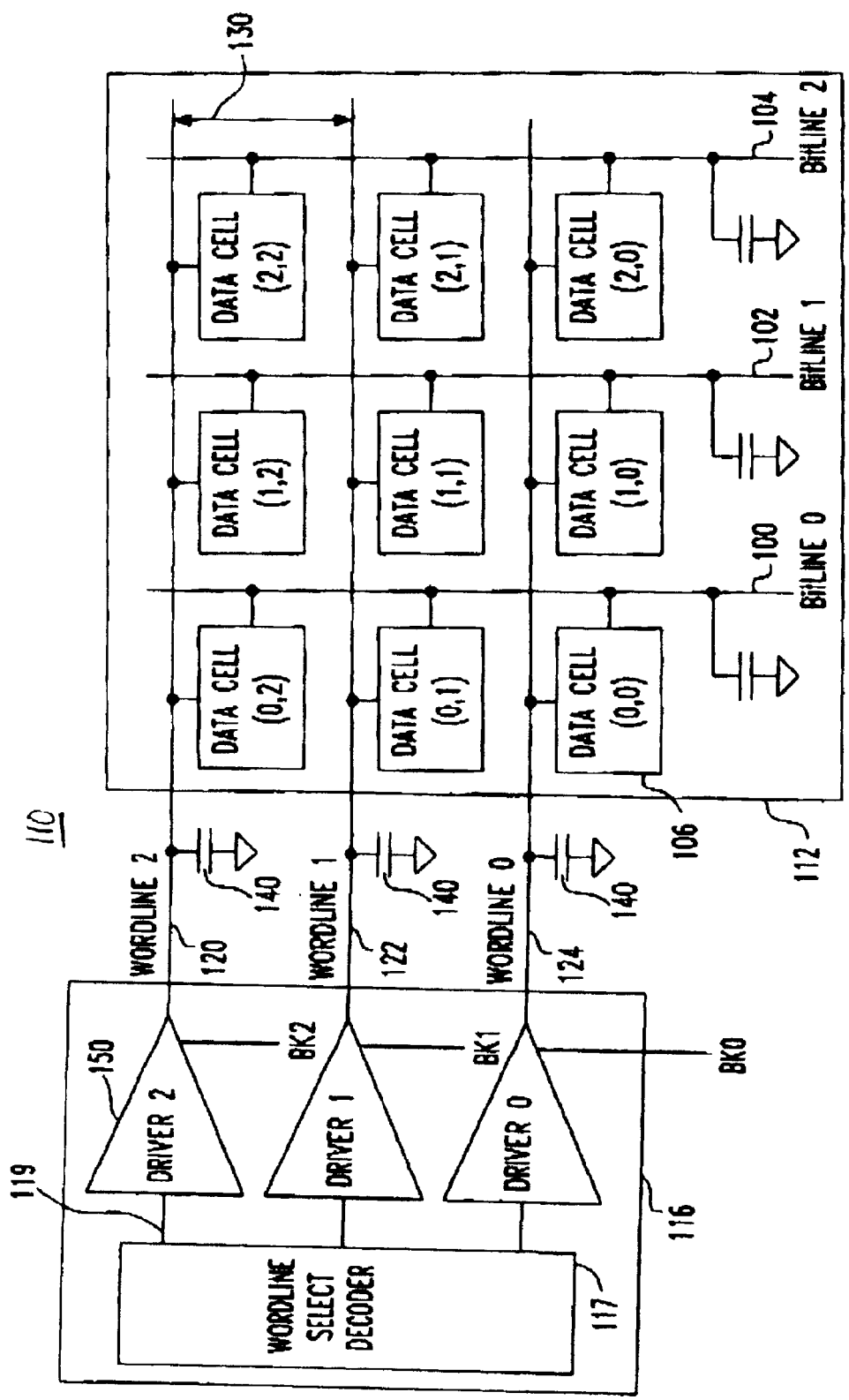
FIG. 2 is a block and schematic diagram illustrating the organization and interconnection of circuit elements within a DRAM according to the prior art.
Figure 3:
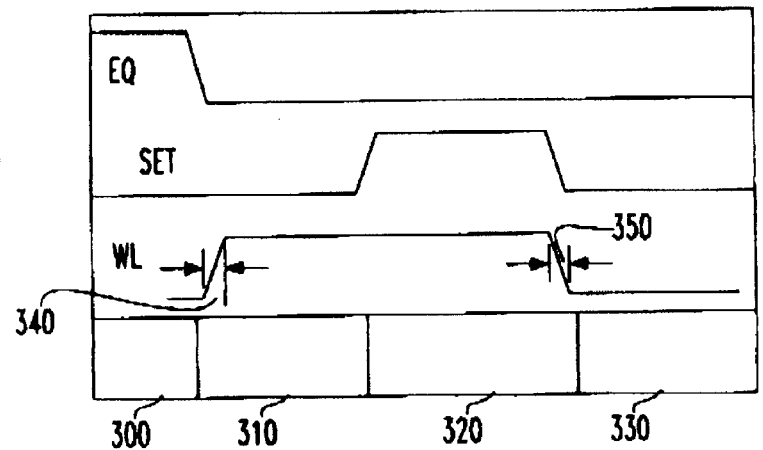
FIG. 3 is a diagram illustrating the timing of operations in a DRAM according to the prior art.
Figure 4:
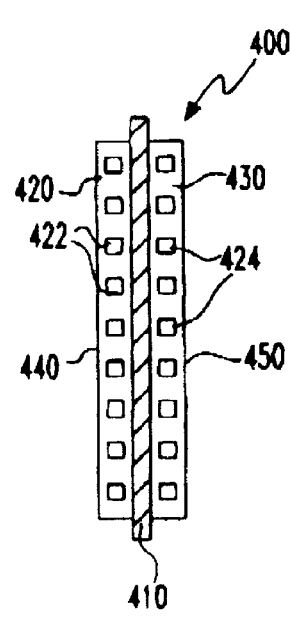
FIG. 4 is a plan view illustrating the structure of a field effect transistor (FET) of a wordline driver according to the prior art.
Figure 5:
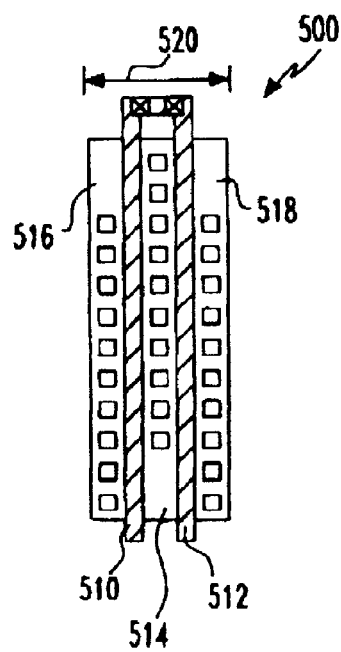
FIG. 5 is a plan view illustrating the structure of a two-finger field effect transistor (FET) of a wordline driver according to the prior art.
Figure 9:
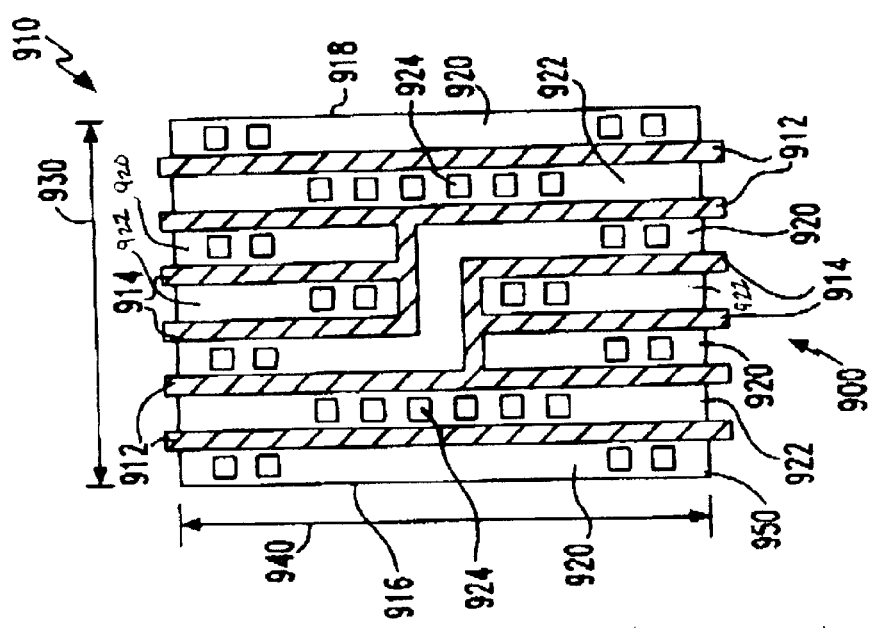
FIG. 9 is a plan view illustrating the structure of a three finger folded wordline driver FET having open gate conductor patterns according to an embodiment of the invention.

This problem is resolved according to embodiments of the invention, as will be described relative to FIGS. 9 and 10, as follows. As illustrated in FIG. 9, in an embodiment of the invention, the FETs 900, 910 of two adjacent wordline drivers are interleaved and are each formed in the shape of an L, each FET having width effectively equal to that provided by three parallel gate conductors. In these embodiments, because the FET now has the effective width of three gate conductor fingers, it is estimated that the drive current output from a FET 900 is increased by 50% above that output by a two-fingered FET 500 such as that shown and described above with respect to FIG. 5.

As shown in FIG. 9, two interleaved L-shaped FETs 900 and 910 are provided within an active area 950 having a width 930 in a vertical direction, which preferably corresponds to the vertical width occupied by eight adjacent wordlines of a data storage array 712 (FIG. 7). An FET 910 is rotated 180 degrees relative to the other FET 900. As shown in FIG. 9, each FET 900, 910 has two fingers 912 which run the length 940 in the horizontal direction of the allotted active area 950. Each FET 900, 910 also has two additional parallel fingers 914 that run only over a portion of the horizontal length of the active area 950.

In the arrangement shown in FIG. 9, source regions 920 are provided both in the interior of the active area 950 and along the outer edges 916, 918 of the vertical width 930. Because the transistor regions provided at the outer edges 916, 918 of the active area 950 are both the same type, i.e. they are source regions 920, they can be shared with other FETs (not shown) of other wordline drivers that are located adjacent to each edge 916 and 918. In such manner, efficient use can be made of the active area 950 because there is no need for an isolating gap between the active area 950 and neighboring active areas (not shown) for other FETs. In addition to the source regions 920, drain regions 922 are provided in the active area 950 on opposite sides of each gate conductor finger 912 from each source region 920. A set of contacts 924 to the drain regions 922 of each of the FETs 900, 910 provide the current drive output from the FETs.

Figure 10:
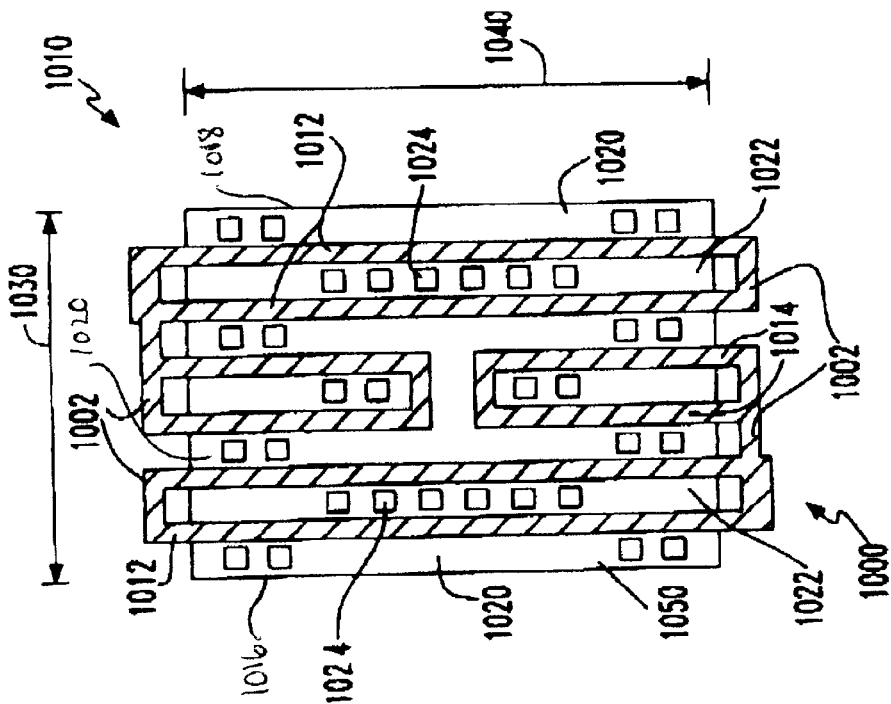
FIG. 10 is a plan view illustrating the structure of a three finger folded wordline driver FET having closed gate conductor patterns according to another embodiment of the invention.

In another embodiment, as illustrated in FIG. 10, the FETs 1000, 1010 of two adjacent wordline drivers have gate conductor fingers 1012 connected by vertical connections 1002 to provide interleaved ring-shaped gate conductors of the FETs. Each FET 1000, 1010 is further formed in the shape of an L, each FET having width effectively equal to that provided by three parallel gate conductors. In this embodiment, because the FET 1000, 1010 now has the effective width of three gate conductor fingers, it is estimated that the drive current output from a FET 1000 is increased by 50% above that output by a two-fingered FET 500 such as that shown and described above with respect to FIG. 5.

As shown in FIG. 10, two interleaved L-shaped FETs 1000 and 1010 are provided within an active area 1050 having a width 1030 in a vertical direction, which preferably corresponds to the vertical width occupied by eight adjacent wordlines of a data storage array 712 (FIG. 7).

As described above relative to FIG. 9, FET 1010 is rotated 180 degrees relative to the other FET 1000. As further shown in FIG. 10, each FET 1000, 1010 has two fingers 1012 which run the length 1040 in the horizontal direction of the allotted active area 1050. Each FET 1000, 1010 also has two additional parallel fingers 1014 that run only over a portion of the horizontal length 1040 of the active area 1050.

In the arrangement shown in FIG. 10, source regions 1020 are provided both in the interior of the active area 1050 and along the outer edges 1016, 1018 of the vertical width 1030. Because the transistor regions provided at the outer edges 1016, 1018 of the active area 1050 are both the same type, i.e. they are source regions 1020, they can be shared with other FETs (not shown) of other wordline drivers that are located adjacent to each edge 1016 and 1018. In such manner, efficient use can be made of the active area 1050 because there is no need for an isolating gap between the active area 1050 and neighboring active areas (not shown) for other FETs. In addition to the source regions 1020, drain regions 1022 are provided in the active area 1050 on opposite sides of each gate conductor finger 1012 from each source region 1020. A set of contacts 1024 to the drain regions 1022 of each of the FETs 1000, 1010 provide the current drive output from the FETs.

Various modifications and enhancements of the invention can be made without departing from the scope of the invention. In another embodiment, a greater number of FETs, e.g. three FETs, each having an L-shaped structure as shown in FIGS. 9 or 10, can be fitted into a given active area having a vertical width. The vertical width of the active area, in turn, corresponds to a different number of wordlines, for example, six wordlines or eight wordlines of the data storage array 712. In such manner, the L-shaped FET structures shown in either FIG. 9 or FIG. 10 would be implemented to increase the channel width of such FET under circumstances other than the particular situation above in which the FET is provided within an active area having the vertical array width in which four wordlines are vertically disposed.

The principles of the invention apply equally to the structure and fabrication of FETs having a pitch equivalent to any odd number of gate conductor fingers, for example, FETs having a pitch of five, seven or nine fingers. In an embodiment, a FET having a pitch equivalent to five gate conductor fingers is arranged in a manner similar to that described above. In such embodiment, the FET has four fingers which run the horizontal length of the device and a fifth finger which is folded into two fingers which run only about half the length of the device. In such embodiment, the current drive of the FET is increased by 25% over a FET having only four fingers. Similarly, in another embodiment, a FET having a pitch equivalent to seven gate conductor fingers is provided. In that embodiment, six fingers run the horizontal length of the device and a seventh finger is folded into two fingers which run only about half the length of the device. The current drive of such FET having a seven-finger pitch is increased by 16% over a FET having only six fingers.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. An integrated circuit including a field effect transistor (FET) comprising:
   a gate conductor having an even number of fingers disposed between alternating source and drain regions of a substrate, said fingers being disposed in a pattern over an area of said substrate having a length in a horizontal direction, said area equaling said length multiplied by a width in a vertical direction occupied by an odd number of said fingers.

2. The integrated circuit of claim 1 wherein said width is a minimum width for providing said odd number of fingers within the integrated circuit.

3. The integrated circuit of claim 1 wherein said FET is a first FET of a column of said FETs including said first FET and a second FET disposed adjacent to said first FET, wherein a source region of said first FET is shared with a source region of said second FET.

4. The integrated circuit of claim 1 wherein said FET is a first FET of a column of said FETs including said first FET and a second FET disposed adjacent to said first FET, wherein a drain region of said first FET is shared with a drain region of said second FET.

5. The integrated circuit of claim 3 wherein said pattern has an L-shape in which a first group of said fingers is disposed over a first length of said area and a second group of said fingers is disposed over a second length of said area being smaller than said first length.

6. The integrated circuit of claim 5 wherein the number of fingers in said first group is two, the number of fingers in said second group is two, said first length is equal to said length of said area, said second length is a portion of said length of said area, and said odd number of fingers is three.

7. The integrated circuit of claim 5 wherein said first FET and said second FET are disposed such that said second group of fingers of said second FET are disposed vertically adjacent to said first group of fingers of said first FET, and said second group of fingers of said first FET are disposed vertically adjacent to said first group of fingers of said second FET.

8. The integrated circuit of claim 7 wherein the number of fingers in said first group is two, the number of fingers in said second group is two, said first length is equal to said length of said area, said second length is a portion of said length of said area, and said odd number of fingers is three.

9. The integrated circuit of claim 8 wherein said first FET is conductively connected to a first wordline of a data storage array for driving a voltage on said first wordline and said second FET is conductively connected to a second wordline of a data storage array for driving a voltage on said second wordline.

10. The integrated circuit of claim 1 wherein said fingers of said FET are connected by one or more vertically extending portions of said gate conductor.

11. The integrated circuit of claim 1 wherein at least one of said fingers of said FET is not connected to any other said finger by a vertically extending portion of said gate conductor.

12. An integrated circuit including a plurality of wordline drivers, each said wordline driver comprising:
   a first field effect transistor (FET) conductively connected to a wordline of a data storage array for driving a voltage on the wordline, said first FET arranged in a column of FETs including said first FET and a second FET disposed adjacent to said first FET, wherein a source region of said first FET is shared with a source region of said second FET, said first FET including:
   a gate conductor having an even number of fingers disposed between alternating source and drain regions of a substrate, said fingers being disposed in an L-shaped pattern over an area of said substrate having a length in a horizontal direction, said area equaling said length multiplied by a width in a vertical direction occupied by an odd number of said fingers.

13. A method of making a field effect transistor (FET) of an integrated circuit, comprising:
   forming a gate conductor having an even number of fingers, said fingers being disposed in a pattern over an area of a substrate having a length in a horizontal direction, said area equaling said length multiplied by a width in a vertical direction occupied by an odd number of said fingers; and
   forming a plurality of source regions and drain regions in said substrate alternating with said fingers.

14. The method of claim 13 wherein said width is a minimum width for providing said odd number of fingers within the integrated circuit.

15. The method of claim 13 further comprising forming said FET as a first FET of a column of said FETs including said first FET and a second FET disposed adjacent to said first FET, wherein a source region of said first FET is shared with a source region of said second FET.

16. The method of claim 13 further comprising forming said FET as a first FET of a column of said FETs including said first FET and a second FET disposed adjacent to said first FET, wherein a drain region of said first FET is shared with a drain region of said second FET.

17. The method of claim 15 wherein said pattern has an L-shape in which a first group of said fingers is disposed over a first length of said area and a second group of said fingers is disposed over a second length of said area being smaller than said first length.

18. The method of claim 17 wherein the number of fingers in said first group is two, the number of fingers in said second group is two, said first length is equal to said length of said area, said second length is a portion of said length of said area, and said odd number of said fingers is three.

19. The method of claim 17 wherein said first FET and said second FET are formed such that said second number of fingers of said second FET are disposed vertically adjacent to said first number of fingers of said first FET, and said second number of fingers of said first FET are formed vertically adjacent to said first number of fingers of said second FET.

20. The method of claim 19 wherein the number of fingers in said first group is two, the number of fingers in said second group is two, said first length is equal to said length of said area, said second length is a portion of said length of said area, and said odd number of fingers is three.

* * * * *